United States Patent [19]

Smith

[11] Patent Number: 4,843,961
[45] Date of Patent: Jul. 4, 1989

[54] STENCIL PRINTING WITH VACUUM SUPPORT FRAME

[76] Inventor: Michael S. Smith, 7256 Rte. 212, Saugerties, N.Y. 12477

[21] Appl. No.: 25,322

[22] Filed: Mar. 12, 1987

Related U.S. Application Data

[63] Continuation-in-part of Ser. No. 667,633, Nov. 2, 1989, Pat. No. 4,649,817.

[51] Int. Cl.⁴ .................. B41F 15/20; B41F 15/34
[52] U.S. Cl. .................. 101/127.1; 101/128.4
[58] Field of Search .......... 101/114, 115, 126, 127, 101/127.1, 128.1, 129, 128.4; 355/91, 93, 94

[56] References Cited

U.S. PATENT DOCUMENTS

| | | | |
|---|---|---|---|
| 2,239,619 | 4/1941 | Murgatroyd et al. | 101/115 |
| 3,150,583 | 9/1964 | Reed III et al. | 95/77 |
| 3,172,358 | 3/1965 | Weiss | 101/126 |
| 3,221,648 | 12/1965 | Weiss . | |
| 3,221,649 | 12/1965 | Weiss | 101/126 |
| 3,372,638 | 3/1968 | Tripp . | |
| 3,463,587 | 8/1969 | Oltra et al. | 355/93 |
| 3,871,293 | 3/1975 | Valiela . | |
| 3,964,385 | 6/1976 | Knight . | |
| 4,083,301 | 4/1978 | Black . | |
| 4,388,862 | 6/1983 | Thomas, Jr. . | |
| 4,484,813 | 11/1984 | Maher . | |

FOREIGN PATENT DOCUMENTS 1567478 5/1969 France .
2143473 2/1985 United Kingdom ............ 101/129

OTHER PUBLICATIONS

*Screen Printing*, Feb., 1984, "Stencil Trouble Shooting chart".

*Primary Examiner*—J. Reed Fisher
*Attorney, Agent, or Firm*—Heslin & Rothenberg

[57] ABSTRACT

A stencil manufacturing and printing process reduces printed image distortion by matching screen deflection in the photostencil preparation phase with stencil deflection in the printing phase. The usual squeegee is replaced by atmospheric pressure and screen/stencil deflection is induced by producing a vacuum through a specially constructed air distribution frame. Compressed air can be introduced through the same frame to rapidly release the stencil from the substrate when the printing is completed. A control unit incorporating a pressure sensor facilitates control of the printing process. The frame may have a 2-piece construction with the stencil/screen supported by a removable insert and the air distribution and pressure level sensing functions afforded by a master frame into which the insert fits.

1 Claim, 8 Drawing Sheets

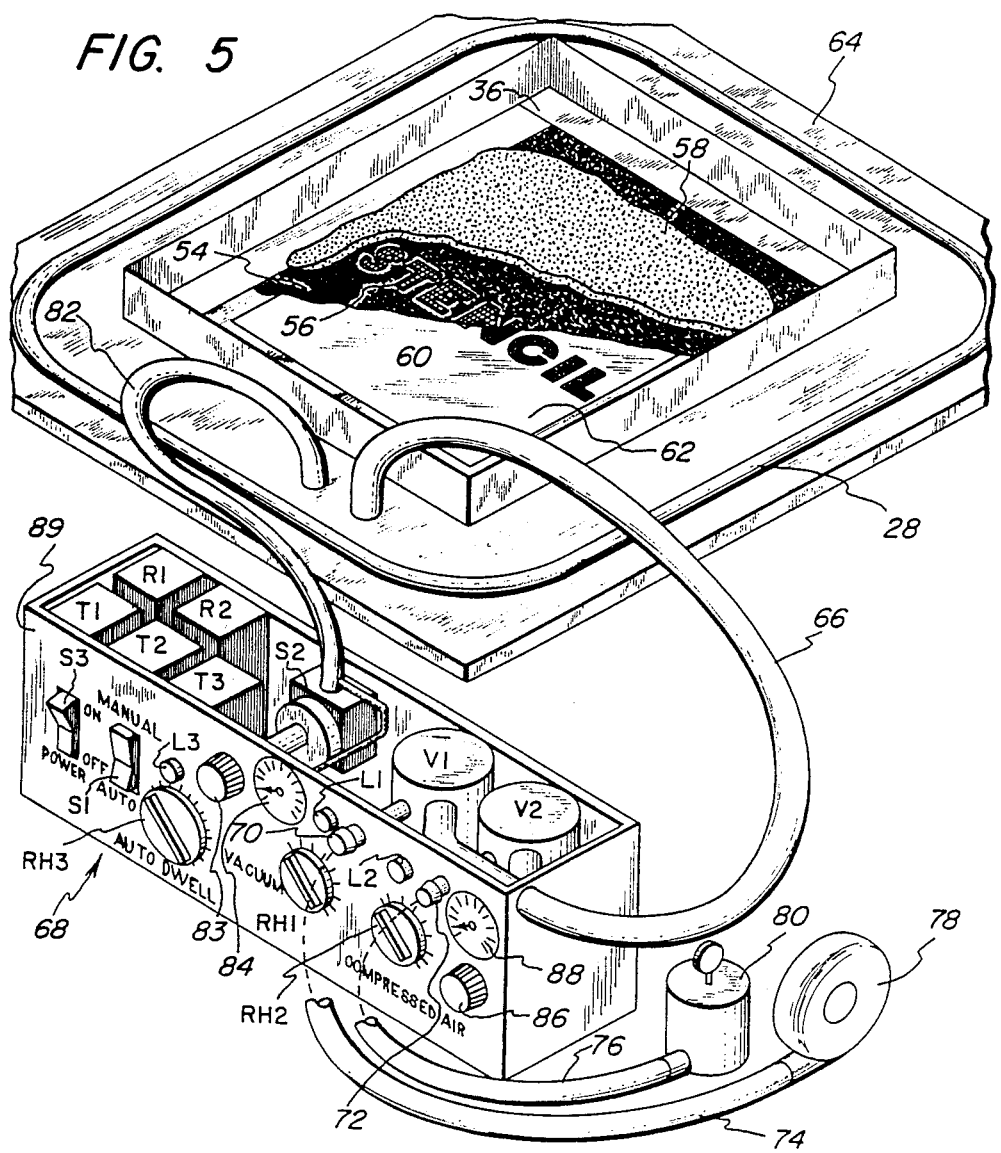
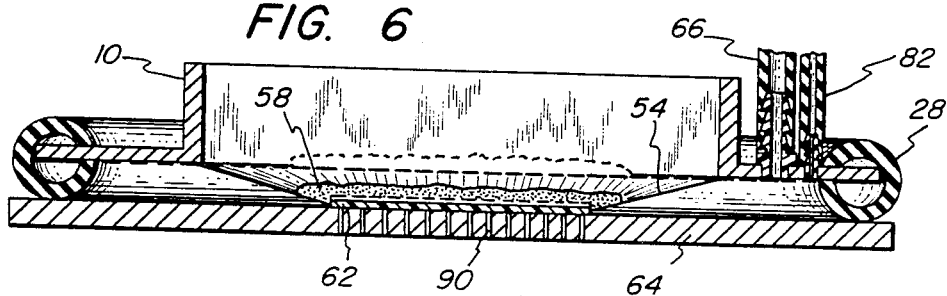

STENCIL PRINTING WITH VACUUM SUPPORT FRAME

RELATED APPLICATION

This application is a continuation-in-part of application Ser. No. 667,633 filed Nov. 2, 1984, now abandoned U.S. Pat. No. 4,649,817.

BACKGROUND OF THE INVENTION

1. Technical Field

This invention relates, in general, to "silk scree" printing and more particularly to an improved process and new apparatus for manufacturing and printing with a stencil which provides greater accuracy and speed and significantly reduced distortion.

2. Background Information

"Silk screen" printing is an old and well established art which employs a screen supported stencil to provide a dense and opaque layer of ink on a substrate. The name "silk screen" comes from the threads originally used to support the various individual elements of the stencil. Today, this printing process enjoys widespread commercial application and is used to print on such diverse items as dishes, dials, poster board, plexiglass sheets, textiles and silicon wafers. In the electronics industry the process is sometimes referred to as thick-film printing.

The process involves two phases: stencil manufacture and stencil printing. In the manufacture of a stencil, the screen fabric (now generally polyester, not silk) is stretched tightly across a stable frame to which it is adhered. This stretched screen is then coated with a photosensitive emulsion. A film positive, containing an opaque image on a clear film base of the art to be printed, is placed in contact with the bottom of the emulsion coated screen. Both are then placed in a vacuum frame consisting of a glass plate and a rubber blanket. Air is withdrawn from between the glass and the rubber sandwiching the screen and contiguous positive between the two. U.S. Pat. No. 3,463,587 illustrates such a vacuum frame used for preparing silk screen stencils.

The emulsion coated screen is photo exposed by beaming a strong light through the glass of the vacuum frame to harden all emulsion not masked from the light by the opaque lines of the film positive. The exposed screen is then removed from the vacuum frame to be dampened by a spray of water that dissolves all unhardened areas completing the stencil making process.

The stencil is now ready for printing. This generally requires, in addition to the ink and the substrate to be printed on, three basic appliances. The first is a table to support the stencil and the substrate to be printed on. The table is commonly perforated and attached to a vacuum to hold the substrate securely during the printing process. The second appliance is a hinge/clamp device that attaches the stencil frame to the table so that it may be raised and lowered to the exact same position each time a new substrate is placed on the table for printing. The third commonly used appliance is the squeegee, a resilient scraping device that spreads the ink across the back of the stencil and applies the pressure that causes the ink to pass through the stencil onto the substrate.

With these basic elements, a number of complex mechanisms have been constructed. These include the hand-operated, semi-automatic, three-quarter automatic, fully automatic, as well as cylinder and rotary screen printers. With the exception of the highly specialized rotaries, these prior printers all generally utilize the frame stretched stencil and the squeegee. The cylinder press has a drum bed (table) instead of a flat bed and its stencil reciprocates in a motion with the drum bed instead of hinging or rising to allow the replacement of a substrate.

In general, the screen printing process employs the following sequence of steps: after a register is determined and all adjustments have been made (called setup) an amount of ink is placed on the stencil outside of the image area, as wide as the image, and a squeegee slightly wider than the image is placed behind the ink, pressed down and moved with even pressure across the image area forcing the ink through the open stencil spaces and onto the substrate. The screen is then lifted and the ink is pushed back over the image area with little pressure returning it to the point of origin and "flooding" the screen in the process. While the screen is raised, the substrate is released and removed for drying and another substrate is placed in registry on the table so the sequence can begin again.

With the exception of rotary screen printers, the sequence described above is generally used by all mechanisms that use a screen/stencil for printing. Variations may occur as system options such as flood bars that return the ink by lifting and carrying it instead of coating the image area; or, as in the case of the cylinder press, a stationary squeegee may be made to traverse the image area by moving the stencil and the bed in unison relative to a stationary squeegee. This same variation is used when cylindrical objects such as bottles or glasses are stencil printed. On the whole, though, adaption or modification of the individual characteristics of the basic sequence does not change the function of the sequence. The ink is still forced through a frame-supported stencil by a squeegee to produce the desired impression.

A brief description of some basic characteristics of screens and the screen/stencil printing process is helpful in understanding the wide application of this technology. First, the screens that support the stencils are woven in a range of fineness from as coarse as 16 threads per inch, with a thread thickness of 0.0138 inches to as fine as 1735 threads per inch with a thread thickness of 0.0008 inches. Since the emulsion coating completely encapsulates the screen and the ink is deposited relative to the emulsion thickness, the thickness of the impression from the stencil is equal to a calculable amount based on the thread thickness and the ink film thickness after drying. In applications such as electronic circuit printing or plating and solder resist printing, this ability to control film thickness for functional purposes is a practical and economic use of stencil printing.

The nature of this printing technique also contributes to its wide application. In its most basic form, screen/-stencil printing requires nothing more than a screen supported stencil and squeegee to produce an impression. No mechanism to actuate pressure is needed. For this reason, stencils may print virtually any size without requiring a machine of corresponding dimension. It is only necessary to be able to sufficiently contact the object to be printed. The impression is made by fluid pressure of the ink and the surface attraction of the material under the stencil. Thus screen/stencil printing is versatile enough to print on large, solid objects and minute, delicate objects with virtually the same pressure.

Together, these characteristics make "silk screen" printing a unique printing process fulfilling product demands that establish it as an essential technology in contemporary manufacturing. Nevertheless, the existing process suffers from significant limitations; the most notable of which is image distortion.

The inventor has identified two primary sources of printed image distortion occurring in the existing screen/stencil printing process. The first arises from the use of a squeegee transversing a stencil to apply an image to a substrate. When this instrument is drawn across the stencil-supporting screen fabric an amount of friction-produced stretch and accompanying image elongation is inevitable. Further, the squeegee produces undesirable vibration, and static electricity. The latter can attract dust and other particles in the air producing a glitch in the printed image.

The second principal source of distortion arises because the stencil must be supported a slight distance above the substrate in the printing stage to permit the necessary "peel" of the stencil behind the squeegee that assures good edge definition in the printed image; while, in the photoexposure process, the screen fame is held in planar contact with the glass during the vacuum hold. Since the image is exposed at one level and deflected to another for printing, an additional degree of distortion is also inevitable.

Attempts have been made in the past to eliminate the squeegee from the stencil printing process. See for example, U.S. Pat. Nos. 3,172,358, 3,221,648 and 3,221,649 to F. Weiss. These patented devices employ a vacuum induced through the printing bed to suck ink through the stencil and onto a substrate. This process, however, appears to require a porous substrate which must be prewet with solvent. These requirements coupled with the convex printing bed and the absence of any mechanism for quickly releasing the stencil from the substrate, makes this apparatus unsuitable for fine, close tolerance, printing applications. Note further that there is no recognition in these patents of the second principal source of image distortion discussed above and that the patented structure is inherently incapable of addressing the second problem.

U.S. Pat. No. 3,964,385 is directed to a "Unitary Device and Method For Screen Manufacture and Printing" but fails to recognize and redress the image distortion problems discussed above.

When close tolerances and minimum distortion are required in the screen printing process, for example, in electronics applications, a number of cumbersome procedures have been employed to overcome the distortion problems. These have entailed much time consuming analysis and art modification.

A need thus persists for a stencil printing process and apparatus which can effectively overcome the above described drawbacks of the existing technology.

SUMMARY OF THE INVENTION

Briefly, the present invention satisfies this need by totally eliminating the squeegee from the printing process and employing the screen/stencil as a diaphragm which is equally deflected in the stencil manufacturing and stencil printing stages. Through the selective application of vacuum pressure, the image area of the screen is deflected to contact the film positive in the stencil manufacturing process and the ink bearing stencil is equally deflected to contact the substrate in the stencil printing process. Use of the same air distribution frame dimensional parameters (i.e. peripheral off-contact distance) in inducing both deflections assures precise control over image stability. The invention also contemplates use of a special screen finishing process in the stencil manufacturing phase to further control printing characteristics. Unique control units incorporating a compressed air stencil release mechanism, vacuum level sensor and control circuitry are designed to further facilitate rapid, accurate and distortion free printing.

In a preferred embodiment, the frame has a two-piece construction and includes a master frame providing the air distribution function and a disposable insert which supports the screen/stencil. The master frame is configured to receive the cooperating insert and support the insert so that the periphery of the screen/stencil is maintained at a predetermined off-contact distance. The control unit preferably incorporates a manifold absolute pressure sensor which detects both vacuum and positive pressure levels, and solid state logic circuitry which performs rapid and accurate control function signal processing.

Accordingly, a principal object of the invention is to provide a method and dual purpose stencil manufacturing and printing apparatus which eliminates the primary sources of image distortion in stencil printing.

Another object of the invention is to provide a stencil preparation and printing process and apparatus which is safe, simple, versatile and cost effective as well as precise and controllable.

Yet another object is to provide such a process and apparatus which eliminates the disadvantages associated with a squeegee while improving the accuracy, definition, and image stability of the final printed image.

A further object of the invention is to provide a new and unique approach to "silk screen" printing which correlates and integrates the stencil preparation and stencil printing phases to reduce final image distortion.

A still further object is to provide a screen/stencil supporting frame with an air distribution function that can be employed to selectively and controllably deflect the screen or stencil supported by the frame.

Another object is to provide a stencil supporting, air distribution frame which can easily be constructed from readily available materials, in varying sizes and configurations, and advantageously employed in a wide variety of screen printing applications to print on diverse objects.

Another object is to provide a compact, portable, adjustable, automatic, high-speed and accurate control unit for precisely controlling the deflection of a screen for photo exposure purposes, the deflection of a stencil for printing purposes and/or the deflection of any diaphragm for any desired purpose.

Yet another object of the invention is to provide a special screen finishing process, two-piece frame construction, printing process control unit and stencil rapid release mechanism and other refinements which further facilitate fast, close tolerance, substantially distortion free printing.

Still another object is to provide improvements in both the stencil preparation and stencil printing processes which when integrated produce a superior process and product.

A further object is to reduce the cost, operator training time and skill level, and set up and clean up times and enhance the speed and quality of the stencil printing process.

Another object is to provide apparatus for implementing the improved processes which can be embodied as an add-on to existing thick film or flat bed screen printers to upgrade that equipment for greater precision and higher production rates and to facilitate more cost effective compliance with workplace safety standards.

A further object is to provide a printhead and associated control unit which can be advantageously applied to a vast variety of selective deposition needs to precisely control the depth and/or resolution and/or composition of a deposit and which is applicable to: decorative art; printing of alphanumerics, bar code symbology and other markings; manufacturing of electronic components such as printed circuits and membrane switches; and dispensing of material such as adhesives, pharmacological and biomedical substances.

These and other objects, advantages and features of the invention will be more readily apparent from the following detailed description taken in conjunction with the accompanying drawings in which:

BRIEF DESCRIPTION OF THE DRAWINGS

FIG. 5 is a partially cut-away view of the frame of FIG. 1 and an associated control unit of the present invention employed in the stencil printing phase;

FIG. 6 is a depiction in side view of the stencil printing process of the present invention;

DETAILED DESCRIPTION

Although departing in several fundamental respects from existing practice, the present invention follows the general steps of the "silk screen" process described previously. For purposes of discussion, it is convenient to divide this process into a stencil preparation or manufacturing phase and a stencil printing phase. Previously these phases have generally been considered as separate, independent and unrelated processes. The present invention is unique in that it correlates and integrates these two phases by matching screen deflection occurring in the photostencil preparation phase with the stencil deflection of the printing phase. This is optimally accomplished through the use of a common vacuum inducing, screen/stencil supporting frame, hereinafter sometimes referred to as an air distribution frame or printhead. The term "screen/stencil" and "screen member" are used interchangeably herein to genericly refer to the screen employed in the manufacturing phase and the stencil employed in the printing phase.

Figure 1:
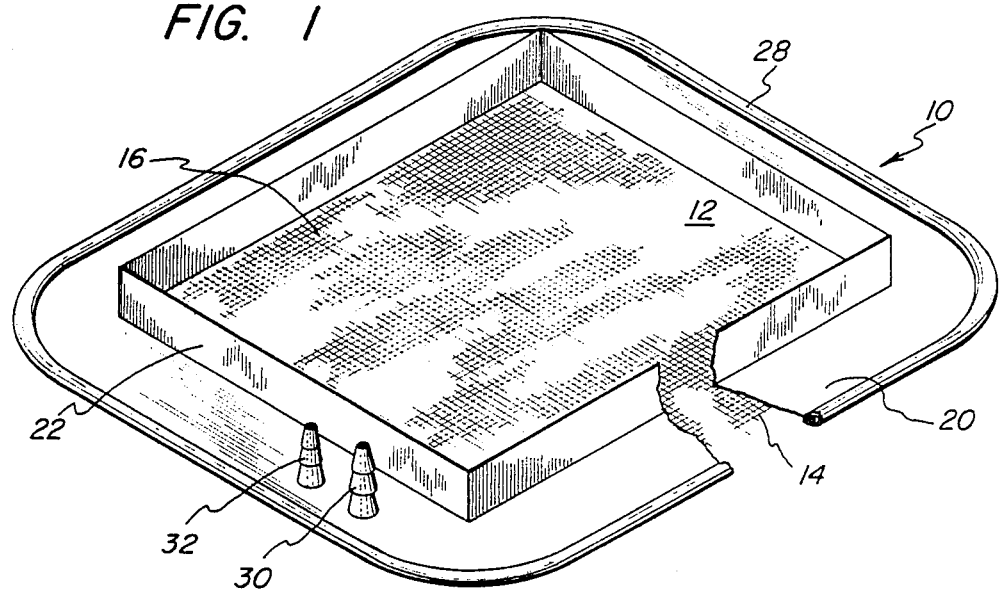
FIG. 1 is a perspective view from the top of one embodiment of the air distribution frame (partially cut away) of the present invention.

A first embodiment of the air distribution frame of the present invention is depicted in perspective view in FIG. 1. As illustrated in this figure, air distribution frame 10 is of generally rectangular configuration. Frame 10 surrounds a central opening 12 across which a screen 14 may be tautly stretched in a manner well known in the art. Screen 14 is peripherally secured to the underside of frame 10 as illustrated in the cut-away view on the right side of FIG. 1. Stretched screen 14 may be adhered to frame 10 by tape, adhesive or any other suitable means. The bond between the screen and frame should be sufficiently strong to allow for repeated deflection of screen 14 out of a first plane in which it is normally held by the frame. Screen 14 includes an image area 16 overlying at least a portion of central opening 12. Image area 16 which may be of any desired size and shape is generally coextensive with the source artwork.

Figure 2:
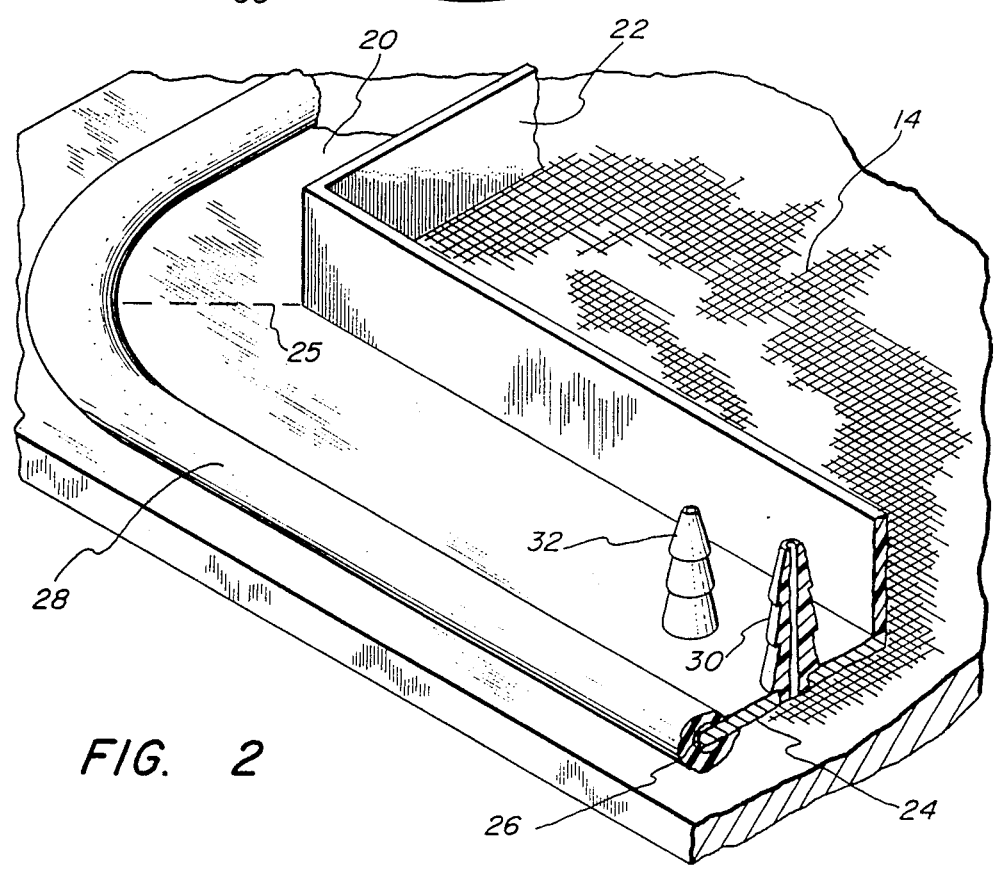
FIG. 2 is a cut-away side view of a portion of the frame of FIG. 1 resting on a supporting surface.

Referring now to both the top view of FIG. 1 and the cut-away side view of FIG. 2, frame 10 preferably includes a first frame member 20 extending around and away from central opening 12 and an upright second frame member 22. The frame is thus, preferably, of angular cross section with the lower edge of second frame member 22 adjacent the inner edge of first frame member 20, and the frame members meeting at substantially 90°.

The frame may be constructed of angle iron cut to length and mitered (as illustrated by dashed line 25 in FIG. 2) to form a frame of any desired size and shape. Alternatively the frame may be of a unitary construction formed by casting or other known techniques. The frame is preferably made of lightweight, strong material such as aluminum or plastic which retains its structural integrity when formed and employed as a screen supporting structure.

First frame member 20, in effect, defines a continuous peripheral band extending around central opening 12. The lower surface 24 of frame member 20 provides the mounting surface for screen 14. Outer edge 26 of frame member 20 preferably serves as a mounting rim for a peripheral gasket 28. The nominal outer corners of frame member 20 are radiused to an even curvature thereby facilitating the attachment of gasket 28 to the outer cornerless border of the band defined by frame member 20. Gasket 28 may comprise slit soft rubber or latex tubing suitably secured to outer edge 26 and lapping under lower surface 24 of frame member 20. The gasket serves to provide a continuous airtight peripheral seal under frame 10. So long as it extends below lower surface 24 and serves this function, the gasket may be formed of other materials, possess other shapes, and be secured at other locations to frame member 20.

Upright frame member 22 lends rigidity and strength to the frame and also provides attachment points for auxiliary clamps or the like which may be used to lift or pivot the frame. The upright frame member may take other forms and shapes and may be discontinuous or, under appropriate circumstances, dispensed with altogether.

Attached to frame member 20 inside the gasket area but outside of upright member 22 is a hose connector or port 30. As shown in FIG. 2, port 30 is a conventional, commercially available hose connector preferably screwed into a threaded aperture extending through frame member 20. Port 30 serves to connect the airtight chamber formed under frame 10 to an external source of pressure as more fully explained hereinafter. Depending upon the size of frame 10 and the capacity of the external pressure source, multiple ports 30 may be provided on the frame.

An additional hose connector or port 32 also in pneumatic communion with the chamber or space under frame 10 is utilized in the stencil printing phase. Port 32 and its associated aperture in frame member 20 may be added after the stencil is manufactured or simply sealed during this initial phase.

Figure 3:
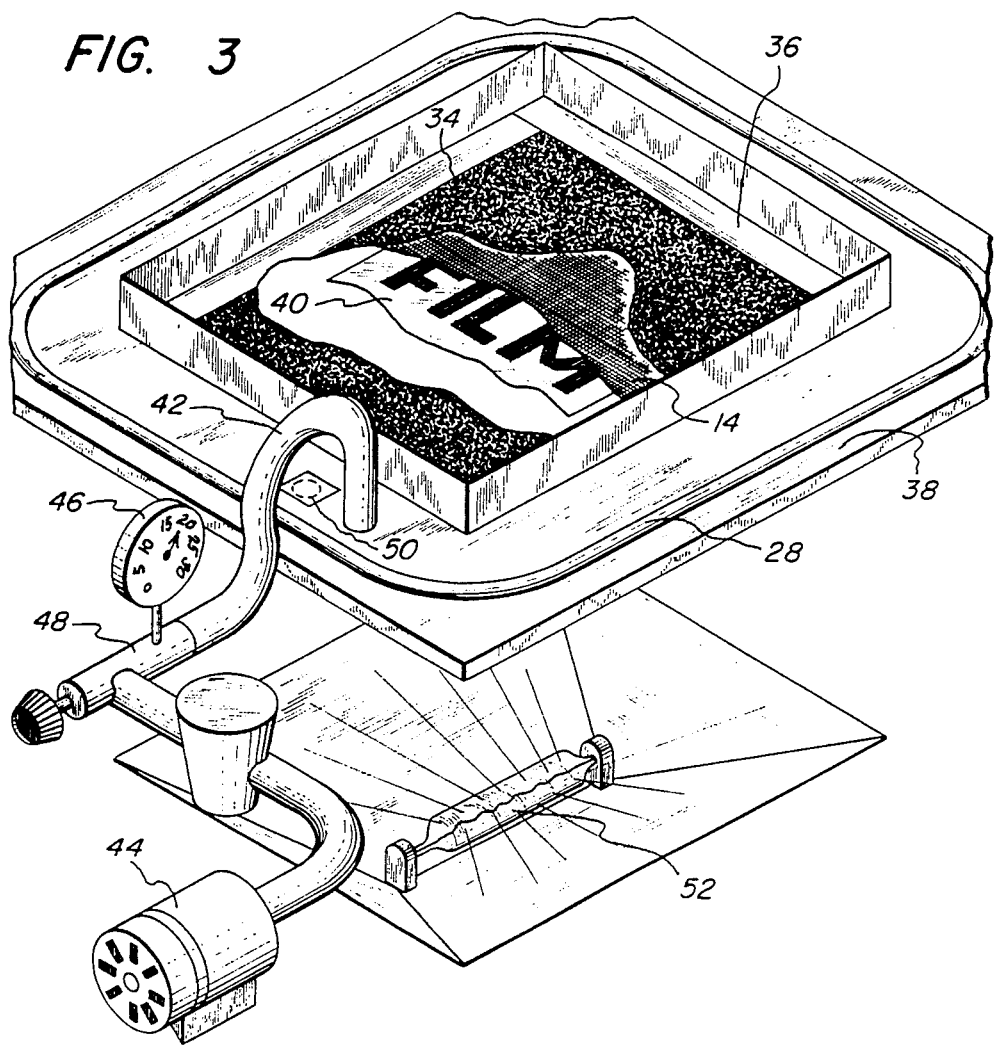
FIG. 3 is a perspective, partially cut-away view of the frame of FIG. 1 and associated equipment employed in the stencil manufacturing phase.
Figure 4:
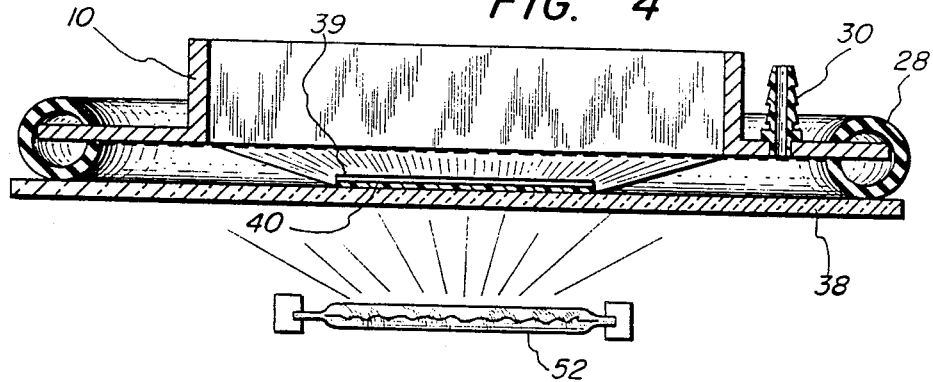
FIG. 4 is a depiction, in magnified side view, of the photostencil manufacturing process of the invention.

As generally illustrated in FIG. 3, for stencil manufacturing purposes, the stretched screen 14 (at a minimum, the image area thereof) is coated with a photosensitive emulsion 34 and any peripheral areas of the screen which remain gas previous are sealed, for example, with tape 36. The frame is then placed on a transparent base, e.g. glass plate 38 of a photoexposure table, in such a way that an emulsion coated image area 39 of the screen overlies a film positive 40 comprising the source artwork Hose 42 from a vacuum source or pump 44 associated with a pressure gauge 46 and a bleeder valve 48, is now attached to frame 10 via port 30 and any aperture in the frame associated with port 32 is sealed, as shown at 50. The vacuum pump is engaged and the screen is drawn down pressing against the film positive. Bleeder valve 48 is adjusted so that the draw of the screen is substantially just to the edge of film positive 40 and not excessively beyond it toward the frame, as shown in FIG. 4. This pressure is observed on gauge 46 and is noted for later use in the printing phase. The noted vacuum pressure is, of course, a measure of the deflection of screen 14 from a first plane (shown in phantom in FIG. 4) in which it is supported by frame 10, to a position in which the image area fully contacts the film positive. Gasket 28 is preferably made of low durometer but substantially unyielding material permitting the gasket to remain firmly seated during air evacuation while maintaining the periphery of the screen at a desired off-contact distance relative to plate 38.

With the screen in its deflected condition, the image area can be photoexposed, in conventional manner, by a light source 52. The rays from this source pass through glass plate 38 and the non-opaque areas of film positive 40 to strike contiguous portions of the screen image area. After photoexposure, the vacuum pressure under the frame is removed allowing the deflected screen to return by atmospheric pressure to its initial frame supported position. The frame supported screen is then removed from the exposure table and the image developed and dried and any necessary touch-up done to produce the desired stencil.

Figure 7:
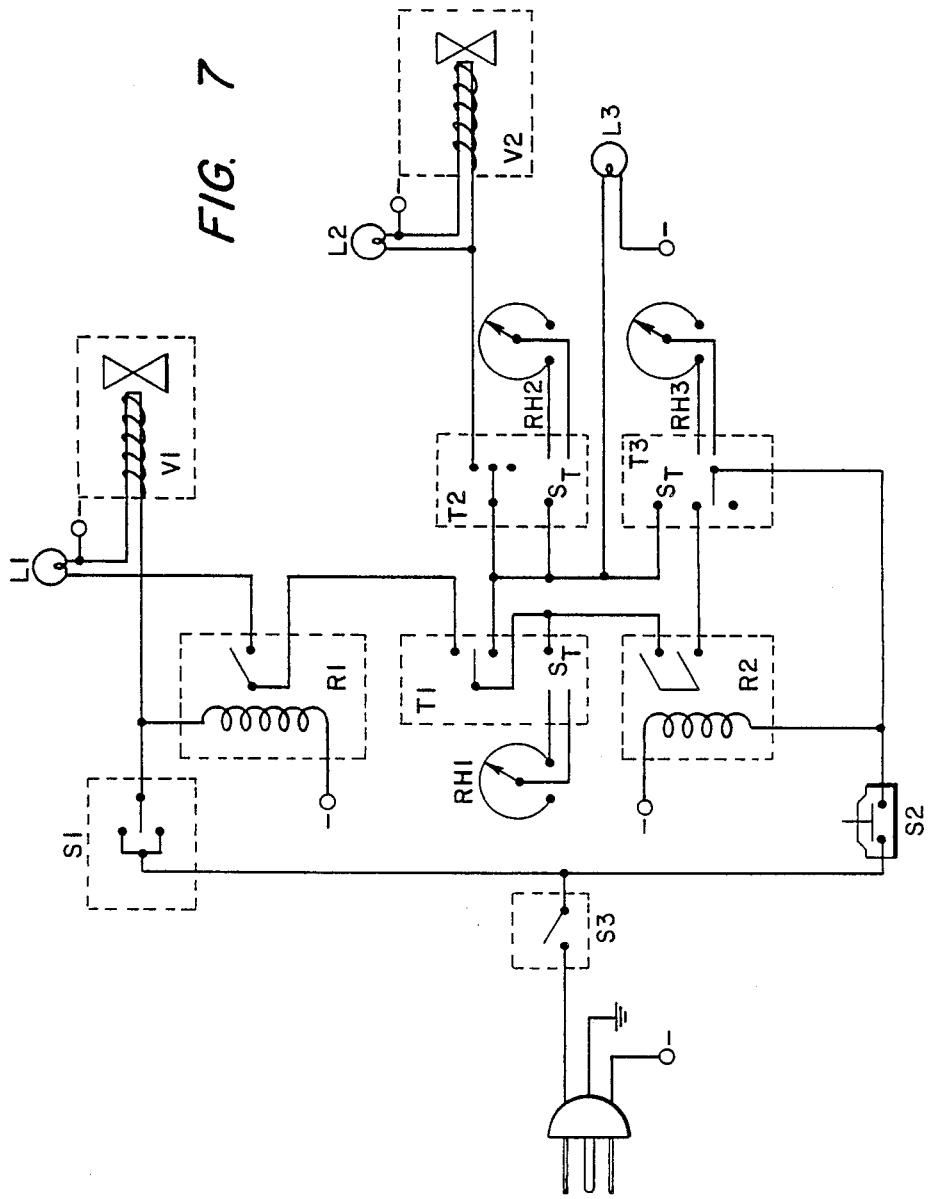
FIG. 7 is a schematic of the control unit shown in FIG. 5.

FIGS. 5-7 illustrate how the stencil mounted on the same air distribution frame (or one peripherally supporting the stencil at the same off-contact distance) is advantageously employed, according to the present invention, in the stencil printing phase.

In FIG. 5 the stencil developed from screen 14 is identified by reference character 54. The developed screen is no longer sealed to air transmission. For printing, the open pores 56 of the stencil 54 are sealed by coating them with a viscous ink 58 that is used to make the impression 60 on a substrate 62 supported on a printing table or platen 64. Substrate 62, although depicted, for illustrative purposes as a thin flat sheet may take on a different shape or form depending upon the particular application. For instance, in the electronics industry, the substrate might be a silicon or other semi-conductor wafer on which a very fine pattern of conductive material is to be deposited. Similarly, the viscous ink may comprise any one of the multitude of known compositions depending upon the particular application.

For printing purposes, frame 10 is connected by port 30 and a hose 66 to a port (not shown) of a control unit 68. The control unit is in turn connected via ports 70 and 72 and hoses 74 and 76 to a vacuum source 78 and a compressed air source 80, respectively. Port 32 connects the frame through tube 82 and a port (not shown) on control unit 68 to a vacuum sensing switch S2 within the control unit.

Control unit 68 (which is depicted with its top cover removed) is equipped with a vacuum valve V1, a compressed air pressure valve V2, and internal hoses for connecting vacuum valve V1 to port 70 and hose 66, and connecting compressed air valve V2 to port 72 and hose 66. The control unit also includes a set of three timers, T1, T2 and T3, three associated timer adjustment knobs (i.e. potentiometers RH1, RH2 and RH3, three corresponding indicator lights, L1, L2 and L3, a master power switch S3, and a three position, mode selection switch S1. The control unit further includes a vacuum pressure adjustment knob 83 coupled to vacuum sensing switch S2 for setting this switch to a particular vacuum pressure level. Gauge 84, connected to hose 82, measures the actual vacuum pressure under frame 10. Knob 86 allows for adjustment of compressed air pressure which is measured by pressure gauge 88. As shown in FIG. 5, related knobs, lights, gauges, etc. are preferably grouped by function on control panel 89 of control unit 68. Finally, control unit 68 contains a set of relays R1 and R2 and electrical wiring. The operation of the various components of the control unit will be fully described, hereinafter, in connection with the schematic of FIG. 7.

The operation of the air distribution frame and associated control unit in the stencil printing stage is depicted in FIG. 6. As shown therein, the stencil 54, laden with ink 58, again acts as a diaphragm; this time moving the ink down to the substrate 62 to make an impression and then returning it back to its rest position (shown in phantom) after the contact. This is accomplished by alternating vacuum draw and compressed air release through the frame, via hose 66, to the gasketed, sealed area under the control of control unit 68. The same pressure used in the exposure stage is employed to deflect the stencil into contact with the substrate to print thereon.

In operation, vacuum sensor switch S2 is adjusted to detect and trigger at a pressure level equal to the reading observed during the exposure phase of the stencil manufacturing process. The substrate 62 to be printed on is secured mechanically or by means of a vacuum holddown 90 to the printing platen 64. When the stencil supporting frame 10 is lowered to seal on the printing platen, the printing cycle begins. The vacuum pressure under the stencil is measured through the sensor tube 82 and when the predetermined vacuum pressure level is reached, vacuum sensitive switch S2 activates vacuum timer T1 which is adjusted to control the deposit of ink. At the end of a first preselected period of time, the vacuum valve V1 is closed and the compressed air valve V2 is opened in time to permit entry of enough air for the rapid release of the stencil from its printing position. The compressed air induces a rapid off contact release which is important in producing a clean impression. The use of matching deflections in the stencil manufacturing and stencil printing phases and the elimination of the squeegee in the printing process overcomes the two primary sources of image distortion thereby resulting in a much more accurate reproduction of the original image.

The operation of control unit 68 will now be described with reference to the electrical schematic of FIG. 7. In general the control unit provides timed control over the compressed air pressure and vacuum used in the stencil printing phase of the present invention in both manual and automatic printing operations. The process proceeds through the following steps: the print cycle begins with a valve V1 supplying vacuum to draw down the stencil; when the predetermined vacuum pressure level is detected, a timer T1 commences timing the vacuum print interval and at its conclusion closes the vacuum valve and begins the timed duration opening of a pressure valve V2 to rapidly release the stencil from the substrate and also begins a timed duration interrupt after which the next print cycle will be allowed to begin. This last step prevents unintended repeated overprinting which would otherwise be possible with the automatic cycling. Instead, the control unit provides for a pause before the next print cycle can be initiated. It should be noted that the duration of all cycles is fully adjustable by means of timer knobs (i.e. potentiometer settings) and that the operation of each cycle is "announced" by a pilot or indicator light adjacent to the respective knob.

In the manual printing mode, the printing cycle is initiated by the operator pushing a spring loaded momentary switch; in automatic operation, the sealing of the stencil frame bottom gasket and the appearance of vacuum initiates the process. A detailed explanation of the operation of the control unit follows.

The circuits in the control unit are energized by turning master power control switch S3 on. A second switch S1, which is a single-pole, double-throw type switch with a center-off position, is then activated. When switch S1 is deflected to its upper momentary contact position, the manual printing process begins. Depression of switch S1 to its lower maintained contact position initiates the automatic printing process. In either event, relay R1 closes and feeds power to the vacuum valve V1 which opens and admits vacuum to the sealed chamber under the frame. As soon as vacuum sensing switch S2 detects the preselected vacuum pressure level, it closes and passes power to vacuum valve V1, which because of the circuitry back-feeding power to the coil of relay R1 locks it and power to the vacuum valve on. Power is also fed to timer T1, the vacuum cycle length timer, i.e. to both this timers relay's common pole and to its "start timing" (ST) cycle connection.

Timer T1 now begins timing how long the vacuum valve is to be opened. It should be understood that timer T1 does not initiate any action until the cycle time has elapsed. When the cycle duration has elapsed, the coil of timer T1's internal relay is energized and three things are effectuated:

1. Power to relay R1's contacts and coil and thus to the vacuum valve V1 is interrupted, thereby terminating the vacuum supply to the frame.
2. Power is now supplied to timer T2, the pressure cycle length timer; this does two things
   a. begins supplying power to the pressure valve V2 (thus opening the valve and flushing the space under the stencil with positive pressure to lift the stencil off the substrate) and
   b. begins timing how long the pressure valve will be energized.
3. Power is supplied to the "start timing terminal" of timer T3, the interrupt duration cycle timer, which times how long it will be before another printing cycle is allowed to be initiated. This interrupt is achieved by running relay R2's coil power lock through the NC contacts of the relay in timer T3. When timer T3's cycle elapses, its relay operates and those contacts break, de-energizing relay R2, which resets all circuits. A new cycle may now be initiated.

For manual operation, the interrupt duration timer T3 is set arbitrarily long enough to allow the printer to make the print and get the screen back up. In automatic printing, the interrupt duration timer is set to allow recycle just before the printing machinery would be setting the stencil down upon a replacement substrate.

Pilot lights L1, L2 and L3 indicate respectively the operation of the vacuum valve timer T1, compressor valve timer T2 and interrupt cycle timer T3. Associated with each timer T1, T2 and T3 are potentiometers RH1, RH2 and RH3 respectively which allow for duration adjustment. Potentiometers RH1 and RH2 might typically have a value of 0–75 K ohms while potentiometer RH3 preferably has a range of 0–2.4 M ohms. Relay R2 and each of timers T1, T2 and T3 contains a double-pole, double-throw relay. Relay R1 preferably comprises a single-pole, single-throw relay. Vacuum sensor switch S2 is preferably a single-pole, single-throw, adjustable, pressure differential type switch which closes on sensing the desired vacuum pressure level. A gauge-cum-switch (such as a Dwyer Photohelic) may be substituted for this switch. The gauge-cum-switch unit has two double-pole, double-throw relays; one could be used as a low-vacuum event switch to feed lock-in power to relay R1 through the common pole of timer T1's internal relay, while the other could be a high-vacuum event switch to feed timer T1's "start timing terminal" to initiate the timing cycle. Other modifications and variations in the control unit circuitry and pneumatic subsystem will suggest themselves to those skilled in this technology.

To assure complete accuracy and controlled layering of the printed impression, the amount of time the stencil contacts the material to be printed and the speed of release of the stencil from the printed substrate are precisely timed. It is also important to limit the pressure of the vacuum used in printing to the same draw that was used in photostencil manufacture. These functions are all regulated by the control unit just described.

A detailed description of the total stencil manufacturing and printing process, of the present invention, will now be presented.

After the image to be printed has been assessed for definition and layering requirements, an air distribution frame, as described, is constructed proportionate to the image area dimensions. Holes are drilled through the frame for the hose connector(s) and a screen fabric of the specification required is stretched and adhered to the frame. A special finishing process is then, preferably, utilized to coat the photosensitive emulsion on this screen.

In this process, the bottom of the screen is coated with a thick layer of "direct" emulsion using a soft, rounded squeegee This layer is dried and then an additional layer is applied to the same side using the same squeegee. Immediately, while this layer is still wet, the screen is placed, face down on a clean smooth sheet of polycarbonate or other non-hydroscopic material and the squeegee is run over the back of the screen laminating the sheet of non-hydroscopic material to the screen bottom. When the screen is dry, the sheet of non-hydroscopic material is removed leaving a screen that is highly flexible and durable with the contact surface perfectly smooth and polished. This coating procedure assures that the emulsion layer is of a controlled thickness, the contact surface is of a quality that produces high definition and the strength of the emulsion hold to the screen is adequate for an extended production life.

This photosensitive screen is then prepared for exposure. Any screen portions between the emulsion and the frame that are still open to air transmission are securely coated or taped. The outside edge of the frame is banded with the peripheral gasket which can be sealed to the frame's upper side and allowed to lip freely around the underside. A hose connector is mounted in one of the holes through the frame and the other (vacuum sensor) hole is sealed. The frame is now fully functional for the exposure phase of the process.

A clean sheet of glass slightly larger than the frame is chosen. If the material to be printed on is to be dimensionally higher than the printing platen, this thickness in clear material is added to the glass and the film positive of the image is positioned on it. The frame is then centered over the film positive on the glass and a hose from the vacuum pump, with associated pressure gauge and bleeder valve, is attached to the frame. The vacuum pump is then engaged and the screen is drawn down to pres against the film positive. The bleeder valve is adjusted so that the draw of the screen is substantially just to the edge of the film positive this pressure is observed on the gauge and noted for later use in the printing stage. The complete unit: frame with deflected screen, film positive and glass is then placed facing a light source and the image is exposed.

After the image on the screen is developed, dried and any necessary touch-up done, the frame is connected by a hose connection and sensor tube connection to the control unit. The stencil is now ready for printing.

The developed stencil is no longer sealed to air transmission. For printing, the open pores in the image area are sealed by coating them with ink. The stencil, landened with ink, is placed over a substrate on a printing platen and a vacuum equal to that employed in the photoexposure phase is created under the stencil. Atmospheric pressure deflects the stencil to contact and transfer ink to the substrate. After a first preselected time period, the vacuum is replaced by compressed air to rapidly release the screen from its printing position. The compressed air is activated for a second preselected time period at the close of which a time duration interrupt occurs to permit substrate replacement.

Referring now to FIGS. 8-11, an alternate embodiment of a printhead or frame 10' is illustrated. In this presently preferred embodiment, frame 10' has a two-piece construction and includes an insert 100 and a master frame 102. As more fully explained hereinafter, insert 100 serves to support the tensioned screen/stencil and is readily removable and replaceable. The master frame receives, secures and supports the insert at a desired off contact distance, and also affords the air distribution function.

Insert 100 comprises a substantially rigid continuous frame member to the underside of which tensioned screen 14' is firmly secured in any known fashion. Insert 100 is preferably provided with an outwardly protruding ridge 104 extending from its top surface 106. As more fully explained hereinafter, ridge 104 helps to retain insert 100 within a master frame 102 during printhead operation.

Figure 11:
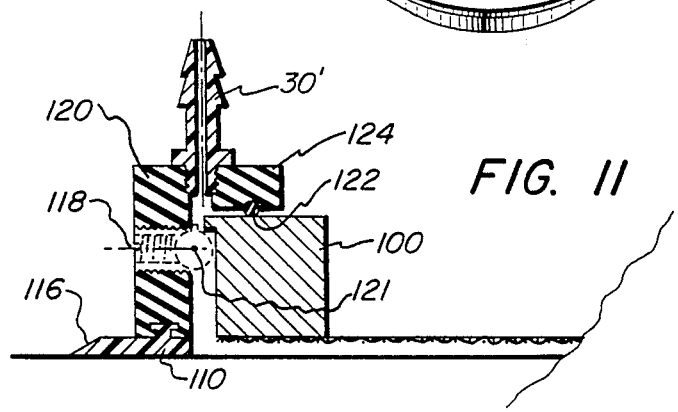
FIG. 11 is a sectional view of the printhead of FIG. 8.

Master frame 102 comprises a rigid continuous frame member having an inverted L-shaped cross section. Attached along the underside 108 of master frame 102 is a peripheral gasket 110. Gasket 110 provides a continuous airtight peripheral seal under master frame 102. This gasket extends measurably below lower surface 108 and serves to define the off-contact distance at which the periphery of screen 14' is supported. As shown, the gasket can advantageously be provided with an upwardly extending portion 112 configured to snugly fit within a matching dove tail groove 114 in the base of master frame 102. In this way, gasket 110 can be secured to the base of master frame 102 in an airtight relation and lateral movement of gasket 110 inhibited. The outer edge 116 of gasket 110 is preferably tapered and slightly downwardly inclined, as best seen in FIG. 11, to ensure a good initial seal. The gasket may be made of hard rubber or other suitable material such that the portion directly below master frame 102 is substantially unyielding and the outer tapered edge 116 is somewhat more flexible. So long as the gasket provides a continuous airtight peripheral seal and maintains the off-contact distance, it may be formed of other materials, possess other shapes and be secured by other means to master frame 102.

A series of locking ball plunger mechanisms 118 are located in spaced apart relationship along the perimeter of master frame 102. Each ball plunger mechanism is screw mounted in a respective threaded aperture extending through the upright wall portion 120 of master frame 102. A ball bearing 121 spring loaded at the end of each plunger mechanism fits below ridge 104 and serves to secure the insert within master frame 102 during printhead operation. The plunger mechanisms also facilitate ready removal and replacement of inserts within the master frame. A continuous O-ring type gasket 122 secured within a channel on the underside of cross leg member 124 of the master frame provides an airtight seal between the top surface of insert 100 and the underside of cross leg member 124 of the master frame.

Also attached to cross member 124 of the master frame are hose connectors or ports 30' and 32'. Connectors 30' and 32' are threadably secured in or otherwise suitably mounted to apertures extending through the master frame member. The apertures are located in cross member 124 between gasket 122 and upright wall 120. Port 30' serves to connect the airtight chamber formed under and along the sides of insert 100 to an external source of pressure while port 32 serves to connect the airtight chamber to an external sensor. Depending upon the size of the frame, and the capacity of the external pressure source, multiple ports 30' may be provided on master frame 102.

Figure 10:
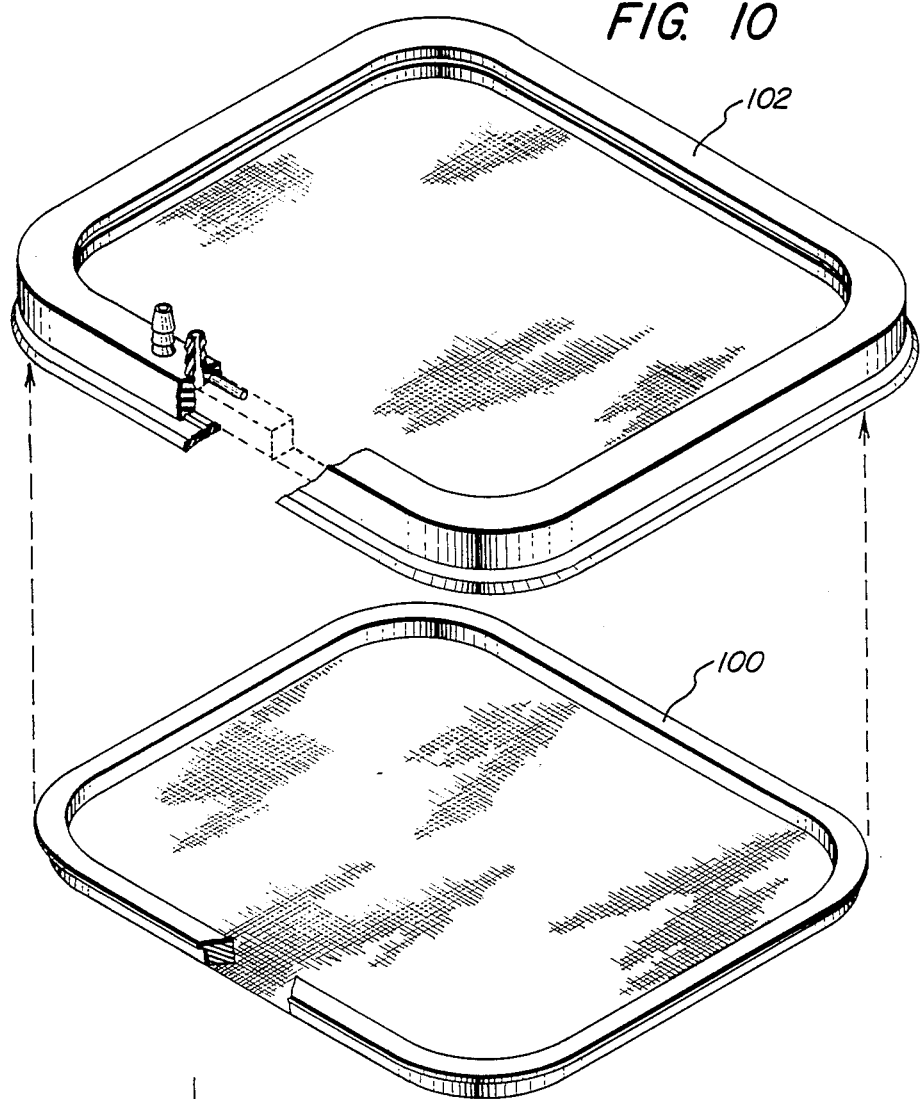
FIG. 10 depicts the manner in which a screen/stencil supporting insert is mounted within a master frame of a printhead.

Master frame 102 and insert 104 are preferably made of lightweight, strong material such as aluminum or plastic which retains its structural integrity when formed and employed in printhead operation. Insert 100 is mounted within master frame 102 from underneath as shown in FIG. 10, and securely held in position therein by the ball plunger mechanisms 118. This mounting arrangement also tends to straighten out any twisting or warp of insert frame 100 which might be produced by the tensioned screen attached thereto. The spring loaded ball at the end of each plunger mechanism has sufficient give to permit entry and removal of the insert frame as desired while also having the capability of securely holding the insert frame pressed against gasket 122 when the ball is seated under ridge 104 during operation of the printhead. Of course, other structures, which perform substantially the same function, may be used instead of the ball plunger mechanisms.

Master frame 102 lends rigidity and strength to the overall frame structure. In addition to the locking ball plungers, it incorporates all necessary gasketing and facilitates the air distribution and pressure level sensing functions. The master frame may also provide attachment points for auxiliary clamps or the like which may be used to lift or pivot the frame.

The two-piece construction and particularly the separation of the screen/stencil supporting function of the insert from the air distribution function of the master frame provide a number of significant advantages. The principal benefit is that the insert can be readily removed, replaced and/or disposed of independent of the master frame. Its simple structure facilitates inexpensive and mass production of such inserts. At the same time, the master frame can be used for an extended period of time with a host of different inserts. These features result in substantial cost savings and faster set-up. This arrangement also allows for the ready variation of screen off-contact distance by simply varying the height of the insert frame.

The two-piece frame can be operated in the same manner, for the same purposes and achieve the same results, as previously described for the one-piece frame. The master frame and associated insert can thus be advantageously employed in conjunction with the vacuum source, bleeder valve and pressure gauge, shown in FIG. 3, for stencil manufacturing purposes and in conjunction with a control unit, such as that shown in FIG. 5, for stencil printing purposes. Alternatively, the frame can be used with the improved control unit 130, illustrated in FIG. 12, for both the photoexposure and printing phases.

Figure 12:
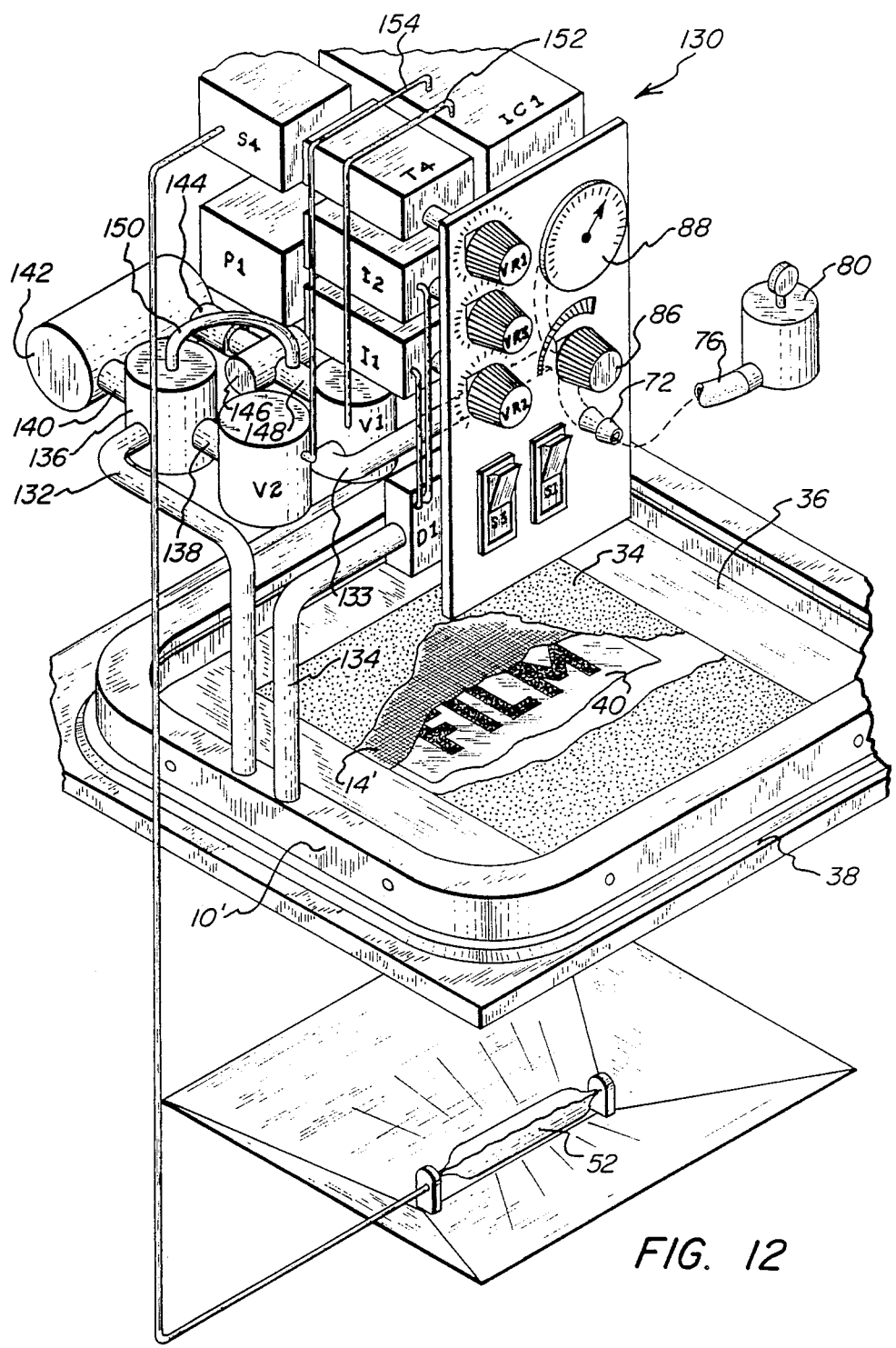
FIG. 12 is a perspective, partially cut-away view of the frame of FIG. 8 in conjunction with a preferred form of the control unit of the present invention employed in the stencil manufacturing phase.

An improved control unit 130 designed to control both screen deflection during photoexposure and stencil deflection during printing is illustrated in FIG. 12. The improved control unit, shown with its cover removed, requires only household current and commonly available shop air to run the printhead thereby eliminating the need for any outside vacuum source. It employs a manifold absolute pressure sensor capable of detecting and indicating both vacuum and pressure levels permitting compressed air release time to be controlled by a sensed pressure reading rather than a timer. Further the improved control unit employs solid state logic circuitry thereby eliminating the need for relays and electromechanical timers, enhancing the speed and accuracy of the control function signal processing, and facilitating the packaging of the control system as a compact portable unit.

In FIG. 12, improved control unit 130 is depicted as it might be used in conjunction with a two-piece frame 10' for photoexposure purposes. In a manner similar to that earlier described with respect to FIGS. 3 and 4, a stretched screen 14' on an insert frame is coated with a photo sensitive emulsion 34 and any peripheral areas of the screen which remain gas pervious are sealed, for example, with tape 36. The insert is then mounted within a corresponding master frame, as earlier described, and the two-piece frame placed upon a transparent base 38 of a photoexposure table so that an emulsion coated image area of the screen overlies the film positive 40. Control unit 130 is employed to controllably deflect the image area of screen 14' into contact with the film positive, as illustrated in FIG. 4, and also to activate light source 52 to produce photoexposure. The control unit operated in a virtually identical manner and with the same preset vacuum pressure rating can also be used to controllably deflect a stencil into contact with a substrate, as illustrated in FIG. 6, for printing purposes.

As shown in FIG. 12, frame 10' is connected to control unit 130 via hoses 132 and 134. Hose 132 connects to port(s) 30' and serves as a conduit for selectively evacuating and pressurizing the airtight chamber formed by frame 10'. Hose 134 connects the airtight chamber through port 32' to an absolute pressure sensor D1 in control unit 130.

Control unit 130 is connected via port 72 and hose 76 to a remote compressed air source 80. Knob 86 allows for adjustment of compressed air pressure which is measured by pressure gauge 88. As more fully explained hereinafter, no external vacuum source is required since control unit 130 contains an air driven venturi type vacuum transducer.

Control unit 130 is equipped with a pair of solenoid operated 2-way valves V1 and V2. Valve V1 serves to control the vacuum level in the airtight chamber under frame 10' while valve V2 controls the supply of compressed air pressure to the airtight chamber. Internal hoses 133 connect both valves V1 and V2 to compressed air input port 72.

The pneumatic circuit within improved control unit 130 includes a 3-way air pilot operated valve 136. The output of valve 136 is connected via hose 132 to frame 10'. The normally open orifice of 3-way valve 136 is connected via hose 138 to air pressure valve V2. The normally closed orifice of valve 136 is connected via hose 140 to a volume chamber 142. A check valve 144 connects the other end of volume chamber 142 through a venturi 146 and connecting hose 148 to the output of vacuum control valve V1. Air pilot input line 150 connects hose 148 to 3-way valve 136 and automatically controls the switching of this valve.

The operation of the pneumatic circuit of control unit 130 will now be described. Air received from external compressed air source 80 is regulated via knob 86 and pressure gauge 88 to a constant pressure for all internal operations of the device. This regulated pressure is piped to the normally closed inlets of solenoid operated valves V1 and V2 through internal hoses 133.

A signal transmitted over line 152 from the electronic circuit IC1 (described hereinafter) opening valve V1 causes two simultaneous events to occur. The regulated air is sent via the air pilot input line 150 to open the normally closed orifice of the 3-way air piloted valve 136. Simultaneously, the regulated air is sent to the venturi-type vacuum pump 146 to draw a suction against check valve 144 that is normally maintained closed by atmospheric pressure. The opening of the check valve permits the venturi to evacuate the air from volume chamber 142 and, through the air piloted opened orifice of the 3-way valve 136, the down stream sealed chamber of the printhead. When valve V1 is closed, the pressure to the air pilot input line and to the venturi is simultaneously interrupted, thus closing the normally closed orifice of the 3-way valve and also allowing atmospheric pressure to close the check valve. This causes a vacuum to be trapped between these two valves in the volume chamber 142. This creates a ballast in chamber 142 which serves to overcome any lag in the system relative to the creation of the necessary vacuum at the venturi and the air pilot operating speed. The size and/or volume of chamber 142 will vary depending upon the displacement of the downstream sealed chamber and connecting hose.

At the end of the photoexposure or print cycle, the regulated pressure is permitted to pass through the normally open orifice of 3-way valve 136. This is accomplished by applying a signal from electronic circuit IC1 via line 154 to open valve V2. This action releases the down stream vacuum at the printhead.

The electrical components of control unit 130 will now be described. As shown in FIG. 12, the control unit includes a single timer T4 connected to a timer adjustment potentiometer VR1; a first comparator I1 connected to pressure sensor D1 and to a vacuum pressure adjustment potentiometer VR2; a second comparator I2 connected to pressure sensor D1 and to atmospheric pressure potentiometer VR3; a power supply P1, e.g. a voltage regulating transformer; a solid state logic array IC1; and master power switch S3, single-pole, double-throw cycle commence switch S1, and an exposure lamp control switch S4.

Figure 13:
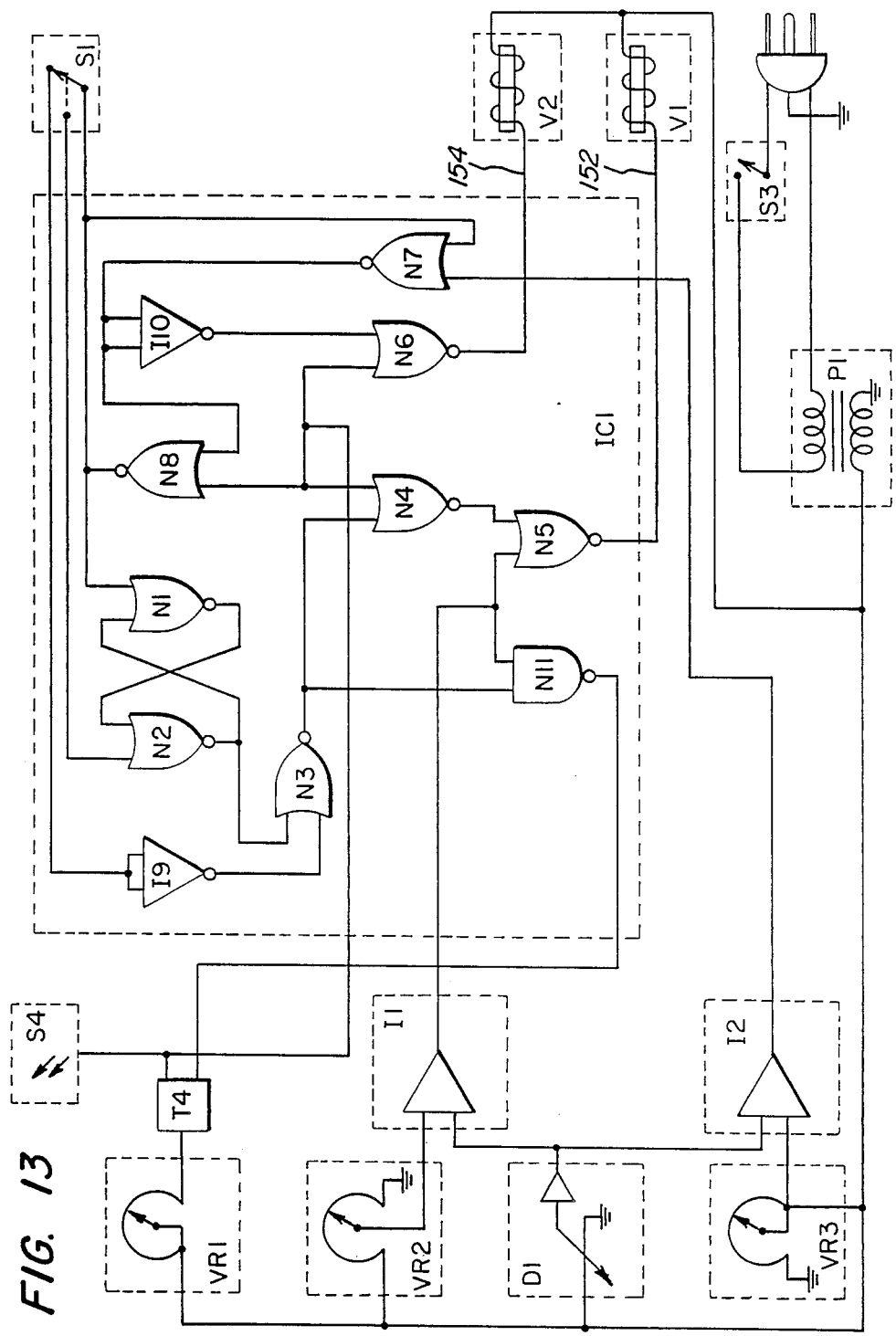
FIG. 13 is an electrical schematic of the control unit of FIG. 12.

The interconnection of the circuit components including a typical solid state logic array are shown in the schematic of FIG. 13 and will be described in detail hereinafter. But first the general operation of the electrical system of the control unit will be presented. The circuits in the control unit are energized by turning master power control switch S3 on. A second, cycle control switch S1 is then activated. When switch S1 is deflected to its momentary contact position and released, the cycle begins. Logic circuitry IC1 signals power to the vacuum valve V1 which opens and admits vacuum to the sealed chamber under the frame. As soon as vacuum sensing device D1 matches the preselected vacuum pressure setting of potentiometer VR2 at comparator I1, a start signal is fed to timer T4, the vacuum cycle timer and to exposure lamp switch S2. The timing period of timer T4 is selected through timer adjustment potentiometer VR1. Comparator I1 compares the vacuum pressure read by sensor D1 with the desired vacuum pressure set at potentiometer VR2 and cycles valve V1 on and off through the logic gates of circuitry IC1 to maintain the desired vacuum pressure in the airtight chamber while timer T4 is active. When timer T4 reaches the timer setting established by potentiometer VR1 it closes valve V1 and deactivates switch S4 while opening valve V2. This produces a replacement of the vacuum level in the airtight chamber with positive pressure. When sensor D1 determines that the positive release pressure from valve V2 has reached the desired atmospheric pressure reading set through potentiometer VR3, comparator I2 closes valve V2 and triggers a flip-flop in circuitry IC1 to end the cycle.

Timer adjustment potentiometer VR1 may be of values from 0-100K ohms to 0-5M ohms depending on its function as a print duration timer (in the millisecond range) or as an exposure length timer (in the range of minutes), respectively. The potentiometer for vacuum adjustment VR2 is typically 0-10K ohms and the potentiometer for atmospheric pressure adjustment VR3 is typically 0-25K ohms. Sensor D1 is a solid state manifold absolute pressure sensor typically found in computer controlled automobile fuel injection systems. The logic circuit is an array of NAND and NOR gates while the comparators and timer typically comprise linear integrated circuit packages The operation of the electrical circuits of control unit 130 will now be described in detail with reference to the schematic of FIG. 13. The analog signals of adjustable potentiometers VR1, VR2, and VR3 and sensor D1 are converted to digital high and low signals at the outputs of comparators I1 and I2 and timer T4. These digital signals are sent through the logic gates of circuitry IC1 to control the process cycle. Circuitry IC1 includes NOR gates N1, N2, N3, N4, N5, N6, N7 and N8, inverter gates I9 and I10, and NAND gate N11 as shown.

When power is switched on, sensor D1 responds to a set variable at potentiometer VR3 equal to atmospheric pressure causing comparator I2 to output a high signal and comparator I1 a low signal. The high output signal from comparator I2 responds to a low output signal from timer T4 to set the flip-flop N1/N2 and lock valve V2 off through the high output of inverter gate N10. The low output of NOR gate N3 maintains the output of timer T4 low and combines with it to drive the output of NOR gate N4 high to lock valve V1 off. At this state all interfaces are inactive except for sensor D1.

To start the cycle, switch S1 is switched to its momentary throw position causing inverter I9 to send a high signal to one input of NOR gate N3 and flip-flop N1/N2 to reset and to send a low signal to the other input of NOR gate N3. For the duration of this momentary throw event, the output of NOR gate N3 remains unchanged from its previous condition and all interfaces remain inactive. When switch S1 is returned to its normally closed position, inverter I9 is driven low matching the low from reset flip-flop N1/N2 and NOR gate N3 outputs a high. This high signal is sent to NAND gate N11 to arm the trigger of timer T4 and to NOR gate N4 to change its output to NOR gate N5 to a low signal. Sensor D1, responding to a set variable at adjustable potentiometer VR2 equal to a percentage of vacuum between the atmospheric pressure setting of potentiometer VR3 and absolute vacuum, will output a low at the output of comparator I1 until the sensed value of D1 equals the set reading of potentiometer VR2. This low is sent to NOR gate N5 and NAND gate N11. At NOR gate N5 it causes valve V1 to be activated; at NAND gate N11 it holds timer T4 in an armed state. Sensor D1, responding to a set variable at potentiometer VR3, reacts to the pressure drop from an activated valve V1 and changes the output of comparator I2 from high to low while the sensed value at sensor D1 is not equal to the set reading at potentiometer VR3. This sends a low to one input of NOR gate N7 which remains low at its output until timer T4 has been triggered.

At the moment that the sensed value of D1 equals the vacuum pressure setting at potentiometer VR2, comparator I1 outputs a high which simultaneously deactivates valve V1 and triggers timer T4. The triggering of timer T4 sends a high from T4 to NOR gates N4, N6 and N8 and exposure lamp switch S4. At NOR gate N8 the signal causes a low output that simultaneously causes inverter I10 to output a low output signal to NOR gate N6 and also causes flip-flop N1/N2 to be set. This set state in turn causes the output of NOR gate N3 to return to low which serves to prevent the re-triggering of timer T4 and to put a low input at NOR gate N4 to drive the output of N4 low. This low output of NOR gate N4 while timer T4 remains high allows a slight rise in the pressure at sensor D1 to continually reactivate valve V1 through comparator I1 when the value at sensor D1 is not equal to the reading at potentiometer VR2, and de-activate valve V1 as the sensor value equals the preset reading at potentiometer VR2 to maintain a precise pressure setting throughout the timer cycle. (The cycle time or period of timer T4 is set at potentiometer VR1.)

At the moment that the timer cycle is completed, timer T4 outputs a low that simultaneously: de-activates valve V1 for the remainder of the cycle by causing NOR gate N4 to output a high; de-activates lamp switch S4 for the remainder of the cycle; and activates valve V2 by causing NOR gate N6 to output a high. The positive pressure of valve V2 returns the sensed value at sensor D1 to the set variable of potentiometer VR3 (i.e. atmospheric pressure) causing comparator I2 to output a high. This high signal drives NOR gate N7 low and, in turn, drives inverter I10 output high and NOR gate N6 output low to de-activate valve V2 and return the entire circuit to the same state as at the beginning.

In summary, control unit 130 provides automatic adjustable time and pressure control over compressed air and vacuum which can be used for both the stencil manufacturing and the stencil printing phases of the present invention. The photoexposure or printing cycle begins with switch S1 opening valve V1 which in turn supplies vacuum to draw down the screen/stencil. When the predetermined vacuum pressure level set at potentiometer VR2 is detected by sensor D1, vacuum pressure valve V1 is closed and timer T4 commences timing the photoexposure or vacuum print interval during which time the logic circuitry IC1 cycles valve V1 open and closed to maintain the precise vacuum setting of potentiometer VR2 for as long as the timer T4 is activated. At the conclusion of the selected time interval, the vacuum valve V1 closes and the logic circuitry IC1 begins the opening of pressure valve V2 to rapidly release the screen/stencil from the substrate until sensor D1 senses a positive pressure equal to the setting at potentiometer VR3, i.e. equal to atmospheric pressure. At atmospheric pressure, valve V2 is automatically closed and the cycle is interrupted through the logic gates of IC1 until another commence signal is received through switch S1. In a manual printing mode, the printing cycle is initiated by the operator pushing the spring-loaded momentary switch S1; in automatic operation, switch S1 can be replaced with a common proximity sensing switch on a typical conveyorized delivery device.

Accordingly, improved control unit 130 is usable in both the stencil preparation and stencil printing phases, optimally implements the matched deflection process of the present invention, affords precise control over screen/stencil deflection and release for any selective deposition need, is packagable as a compact, lightweight, desktop unit and makes possible automatic photoexposure. This latter feature may be utilized to perform other exposure functions. For example, the vacuum control potentiometer could incrementally adjust the deflective membrane of a typical lithographic plate exposure vacuum frame until a preset maximum level of vacuum was obtained for the purpose of eliminating halation-causing pockets of trapped air.

Figure 8:
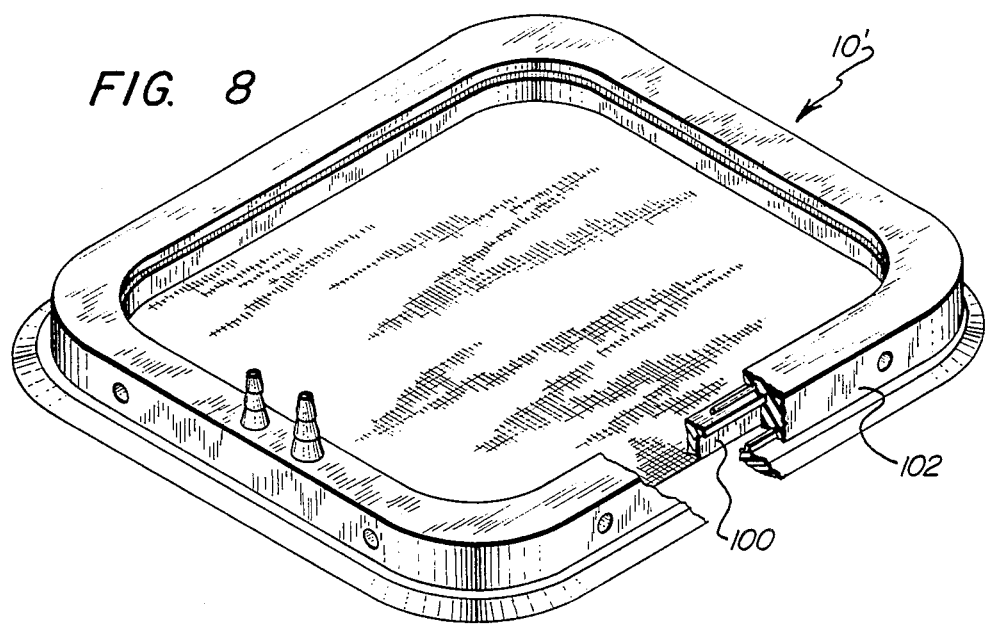
FIG. 8 is a perspective view from the top of a frame or printhead of the present invention having a two-piece construction.
Figure 9:
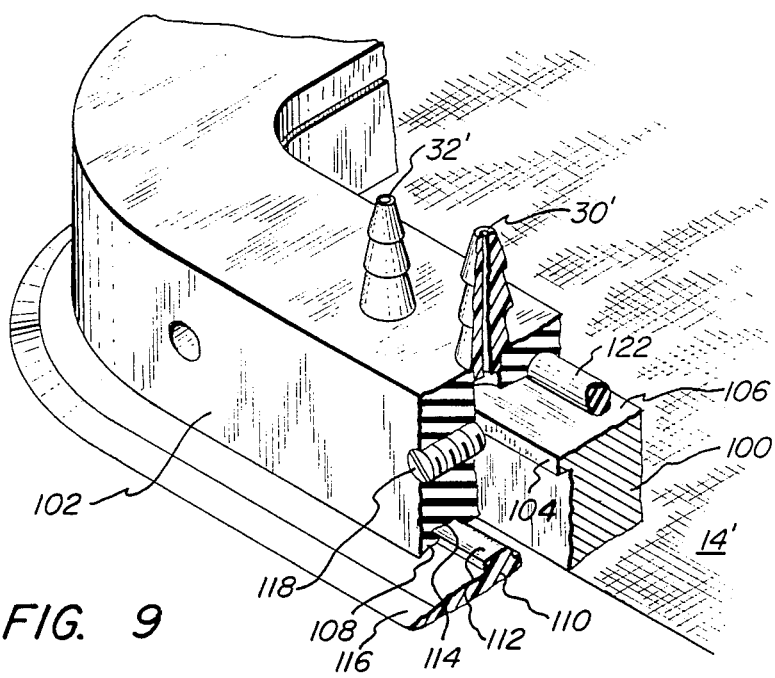
FIG. 9 is an enlarged cut-away side view of a portion of the frame of FIG. 8.

For maximum benefit, control unit 130 can be used with a 2-component printhead such as that shown in FIG. 8. Alternatively, the control unit can be employed with a unitary frame or one of other construction. When utilized together, the printhead and control unit of the present invention allow for extremely rapid, high quality printing. The equipment can be beneficially applied to the fields of marking, decorative art, electronic component manufacturing, material dispensing and wherever else a controlled deposition of material is desired.

It will thus be apparent that the present invention provides a solution to the distortion problems asssociated up until now with "silk screen" printing and facilitates such printing with a speed and accuracy heretofore unobtainable. With solid state sensors and circuits, time settings are practical in the millisecond range depending upon delivery device (e.g. conveyor) cycle rates and the internal limits of the valve mechanical components. With the present invention it is estimated that printing may be possible at speeds in the 10 impressions per second range or 36,000 impressions per hour. At least as important as the improved cycle rate is the added accuracy and controllability of the quality of the individual impression produced. With the present invention, images having lines as fine as 25-30 microns wide and spaces between the lines on the order of 45 microns can be accurately reproduced. The present invention is thus particularly beneficial to the electronics industry and other applications requiring fine printing, close tolerances or minimal distortion.

Although the invention has been described in terms of its presently preferred embodiment, modifications, substitutions and variations may be made within the scope of the invention as defined by the appended claims.

What is claimed is:

1. Apparatus for use in stencil manufacturing and printing comprising, in combination:
    A. A frame comprising:
       frame means for peripherally supporting a stretched and sealed screen member in a first plane;
       a gasket means attached to said frame means and extending beyond said first plane for forming a peripheral air tight seal when the frame rests on a supporting surface and for continuously maintaining the periphery of said screen member at a fixed off-contact distance from said supporting surface;
       first port means secured to said frame means for facilitating connection of a chamber bonded by said screen member, said supporting surface and said gasket means to an external source of vacuum pressure; and
       vacuum sensing port means secured to said frame means for selectively connecting said chamber to vacuum pressure sensor means;
    B. a compressed air source; and
    C a control unit comprising:

means for controlling the vacuum pressure in said chamber;

vacuum pressure sensor means for automatically determining when a desired partial vacuum pressure level exists in said chamber;

means for automatically maintaining said desired partial vacuum pressure level in said chamber for a first preselected period of time, whereby a central portion of selected variable area of a gas impervious screen member supported by said frame means can be controllably deflected from said first plane to contact the substrate located on said supporting surface by selectively reducing the pressure in said chamber to a desired partial vacuum pressure level detected by said pressure sensor means;

means for connecting said compressed air source to said chamber, upon expiration of said first preselected period of time, for a second period of time, whereby a quick release of the deflected portion of the screen member from the substrate can be effected;

common hose means connecting said control unit to said first port means for alternately conveying vacuum pressure and compressed air from the control unit to said chamber;

means for establishing a desired atmospheric pressure level and for disconnecting said compressed air source from said chamber when the pressure in said chamber detected by said sensor means reaches the desired atmospheric pressure level, the vacuum pressure sensor means also detecting positive pressure levels;

a venturi type vacuum pressure transducer for converting compressed air into vacuum pressure;

a 3-way air pilot operated valve for alternately supplying vacuum pressure and compressed air to said common hose means; and means for independently varying the desired vacuum pressure level, first preselected period of time, and desired atmospheric pressure level.

* * * * *

UNITED STATES PATENT AND TRADEMARK OFFICE
CERTIFICATE OF CORRECTION

PATENT NO. : 4,843,961

DATED : July 4, 1989

INVENTOR(S) : Michael S. Smith

It is certified that error appears in the above-identified patent and that said Letters Patent is hereby corrected as shown below:

In column 18, claim 1, line 60, "bonded" should read --bounded--.

Signed and Sealed this

Sixth Day of March, 1990

Attest:

JEFFREY M. SAMUELS

Attesting Officer

Acting Commissioner of Patents and Trademarks